United States Patent

Mukai et al.

(10) Patent No.: US 6,731,044 B1
(45) Date of Patent: May 4, 2004

(54) SURFACE ACOUSTIC WAVE DEVICE HAVING AN INTERDIGITAL TRANSDUCER PROVIDED ON A MAIN REGION OF A PIEZOELECTRIC SUBSTRATE

(75) Inventors: Takao Mukai, Nagaokakyo (JP); Michio Kadota, Kyoto (JP); Hideya Horiuchi, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/692,668

(22) Filed: Oct. 20, 2000

(30) Foreign Application Priority Data

Oct. 20, 1999 (JP) ............................. 11-298577

(51) Int. Cl.[7] .................... H01L 41/04; H01L 41/08; H01L 41/18; H02N 2/00
(52) U.S. Cl. .............................. 310/313 R; 310/313 B; 310/313 D
(58) Field of Search .................... 310/313 R, 313 B, 310/313 D; 333/186, 193, 195

(56) References Cited

U.S. PATENT DOCUMENTS

| | | | | |
|---|---|---|---|---|
| 4,025,954 A | * | 5/1977 | Bert | 358/213 |
| 4,072,915 A | * | 2/1978 | Mitchell | 333/72 |
| 5,220,234 A | * | 6/1993 | Flory et al. | 310/313 D |
| 5,684,437 A | * | 11/1997 | Ago et al. | 333/195 |
| 5,714,830 A | * | 2/1998 | Kadota et al. | 310/313 A |
| 5,793,146 A | * | 8/1998 | Wright | 310/313 B |
| 5,793,147 A | * | 8/1998 | Kadota et al. | 310/313 R |
| 5,838,217 A | * | 11/1998 | Kadota et al. | 333/193 |
| 5,905,418 A | * | 5/1999 | Ehara et al. | 333/193 |
| 5,952,899 A | * | 9/1999 | Kadota et al. | 333/193 |
| 6,163,099 A | * | 12/2000 | Kadota et al. | 310/313 A |
| 6,237,414 B1 | * | 5/2001 | Yukawa et al. | 73/504.01 |
| 6,242,844 B1 | * | 6/2001 | Puttagunta et al. | 310/313 B |
| 6,246,150 B1 | * | 6/2001 | Mitobe | 310/313 B |
| 6,377,139 B1 | * | 4/2002 | Horiuchi et al. | 310/313 B |
| 2002/0057035 A1 | * | 5/2002 | Nakamura et al. | 310/313 B |

FOREIGN PATENT DOCUMENTS

| | | |
|---|---|---|
| JP | 4-82315 | 3/1992 |
| JP | 404082315 A * | 3/1992 |
| JP | 7-142904 | 6/1995 |
| JP | 7-263998 | 10/1995 |
| JP | 7-297074 | 11/1995 |
| JP | 8-195644 | 7/1996 |
| JP | 408195644 A * | 7/1996 |
| JP | 9-190947 | 7/1997 |
| JP | 9-294045 | 11/1997 |
| JP | 409294045 A * | 11/1997 |

OTHER PUBLICATIONS

M. O'Neill; "A Low Temperature Co–Fire Ceramic Materials System for High Performance Commercial Applications"; ISPS '97 Proceedings, Dec. 2–5, 1997; pp. 135–140.

(List continued on next page.)

*Primary Examiner*—Burton S. Mullins
*Assistant Examiner*—Julio C. Gonzalez
(74) *Attorney, Agent, or Firm*—Keating & Bennett, LLP

(57) ABSTRACT

A surface acoustic wave device includes a piezoelectric substrate having a pair of substrate edges and an upper surface therebetween. The piezoelectric substrate has at least one inner edge which is in contact with a main region and extends from the upper surface toward a bottom surface of the piezoelectric substrate inside one of the substrate edges. An interdigital transducer is provided on the main region of the piezoelectric substrate such that a SH type surface acoustic wave excited by the interdigital transducer and having a wavelength of $\lambda$ is reflected by the at least one inner edge. A distance L between the at least one inner edge and the corresponding one of the substrate edges is substantially equal to about $8\lambda$ or less.

11 Claims, 3 Drawing Sheets

OTHER PUBLICATIONS

C. Makihara et al.; "Multifunctional Ceramic Substrates and Packages for Telecommunication Applications"; ISHM '94 Proceedings Nov. 15–17, 1994; pp. 243–247.

M. Kato et al.; "Application of Low Temperature Fired Multilayered Substrates to High Frequency"; ISHM '92 Proceedings; Oct. 19–21, 1992; pp. 263–268.

P.C. Donohue et al.; "High Reliability Copper MCM Systems"; ISHM '92 Proceedings, Oct. 19–21, 1992; pp. 607–612.

Michio Kadota et al., "Ceramic Resonator Using BGS Wave and Its Application", Murata MFG. Co., Ltd., US 91–80, EA 91–93, pp. 20–27.

* cited by examiner

SURFACE ACOUSTIC WAVE DEVICE HAVING AN INTERDIGITAL TRANSDUCER PROVIDED ON A MAIN REGION OF A PIEZOELECTRIC SUBSTRATE

BACKGROUND OF THE INVENTION

1. Field of the Invention

The present invention relates to an edge reflection type surface acoustic wave device which utilizes an SH (shear horizontal) type surface acoustic wave.

2. Description of the Related Art

Edge reflection type surface acoustic wave devices which utilize an SH-type surface acoustic wave are well known. The SH-type surface acoustic wave refers to surface acoustic waves such as a EGS (Bleustein-Gulyaev-Shimizu) wave or a Love wave which have a displacement that is perpendicular to the direction of propagation of the surface acoustic wave and include a main component which is parallel to the surface of the substrate. Of these edge reflection type surface acoustic wave devices, in order to suppress bulk waves or to allow for easy production, some have structures in which a step is provided at the edge of the substrate or a groove is provided on the substrate, and the upper portion of the substrate edge or the inside surface of the groove defines the reflection edge, (refer to Japanese Unexamined Patent Application Publication No. 4-82315 and No. 7-263998). In Japanese Unexamined Patent Application No. 4-82315, for example, it is explained that influences of the bulk wave resonance on the SH wave resonance can be prevented and unwanted spurious responses caused by bulk wave resonance can be efficiently suppressed by providing, at the substrate edge, a step having a greater vertical dimension than the surface of the substrate such that the step is spaced away from the substrate surface resulting in at least 80% of the SH wave energy being concentrated at the step.

However, even if the vertical dimension of the reflection edge is greater than the predetermined value as described above, in some cases, desired resonance characteristics or pass-band characteristics could not be obtained. That is, in a conventional surface acoustic wave device having a reflection edge that is a step or a groove as described above, even if the height of the reflection edge is set to a suitable value, there has been a problem that when the distance between the substrate edge and the reflection edge was larger, ripples occurred in the pass-bands. Moreover, there has been a problem that ripples also occurred as the vertical dimension of the reflection edge became larger.

SUMMARY OF THE INVENTION

In order to overcome the problems described above, preferred embodiments of the present invention provide a surface acoustic wave device in which desired resonance characteristics and pass-band characteristics are reliably obtained by reducing the ripples caused by bulk waves.

According to a preferred embodiment of the present invention, a surface acoustic wave device includes a piezoelectric substrate having a pair of substrate edges and an upper surface therebetween. The piezoelectric substrate has at least one inner edge arranged to contact the main region and extending from the upper surface toward a bottom surface of the piezoelectric substrate inside one of the substrate edges. An interdigital transducer is provided on the main region of the piezoelectric substrate such that a SH type surface acoustic wave excited by the interdigital transducer and having a wavelength of $\lambda$ are reflected by the at least one inner edge. A distance L between the at least one inner edge and the corresponding one of the substrate edges is preferably substantially equal to about $8\lambda$ or less.

It is preferable that the at least one inner edge has a height H in the range of about $2\lambda$ to about $6\lambda$.

The surface acoustic wave device is constructed and function to be included in a communication device.

As explained above, in the surface acoustic wave device according to various preferred embodiments of the present invention, by setting the distance between the substrate end-surface and the reflection end-surface to less than about $8\lambda$, ripples in the pass-band caused by bulk waves are minimized, and excellent resonance characteristics and pass-band characteristics are obtained. Furthermore, by setting the height of the reflection edge within the range of about $2\lambda$ to about $6\lambda$, ripples in the pass-band are minimized, and excellent resonance characteristics and pass-band characteristics are obtained.

Moreover, by mounting the surface acoustic wave device in a communication device according to another preferred embodiment of the present invention, a communication device with excellent characteristics can be obtained.

Other features, elements, characteristics and advantages of the present invention will become apparent from the detailed description of preferred embodiments below with reference to the attached drawings.

For the purpose of illustrating the invention, there is shown in the drawings several forms which are presently preferred, it being understood, however, that the invention is not limited to the precise arrangements and instrumentalities shown.

BRIEF DESCRIPTION OF TEE DRAWINGS

DETAILED DESCRIPTION OF PREFERRED EMBODIMENTS

As will be clear from the results of an experiment described later, the inventors of the present invention have discovered that ripples in the pass-band can be minimized by providing a reflection edge inside of the substrate edge such that the distance between the reflection edge and the corresponding substrate edge is set at a predetermined amount or less and a height of the reflection edge is set at a value in a predetermined range. Thus, it is possible to obtain the desired excellent resonance characteristics and pass-band characteristics.

If the distance between the substrate edge and the reflection edge is not suitable, the bulk waves reflected at the substrate edge strongly affect the pass-band characteristics, and if the height of the reflection edge is more than a certain value, the bulk waves are also reflected by the reflection end-surface and these reflected bulk waves strongly affect the pass-band characteristics.

The surface acoustic wave device according to preferred embodiments of the present invention include devices in general which utilize an SH-type surface acoustic wave such as a surface acoustic wave resonator, a longitudinally coupled resonator filter, a transversely coupled resonator filter, a ladder type filter or other suitable devices. These devices include at least one interdigital transducer (IDT) on a piezoelectric substrate, and a reflection edge for reflecting the surface acoustic wave is located at least one side of the Furthermore, a communication device according to one preferred embodiment of the present invention includes at least one of the surface acoustic wave devices according to other preferred embodiments of the present invention. Thereby, a communication device with excellent characteristics can be obtained.

Figure 1:
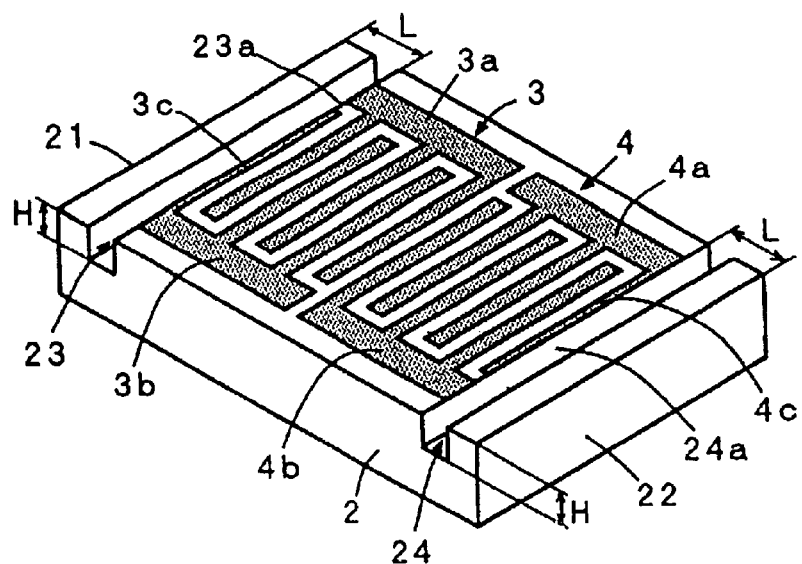
FIG. 1 is a perspective view of a surface acoustic wave device according to a first preferred embodiment of the present invention.
Figure 2:
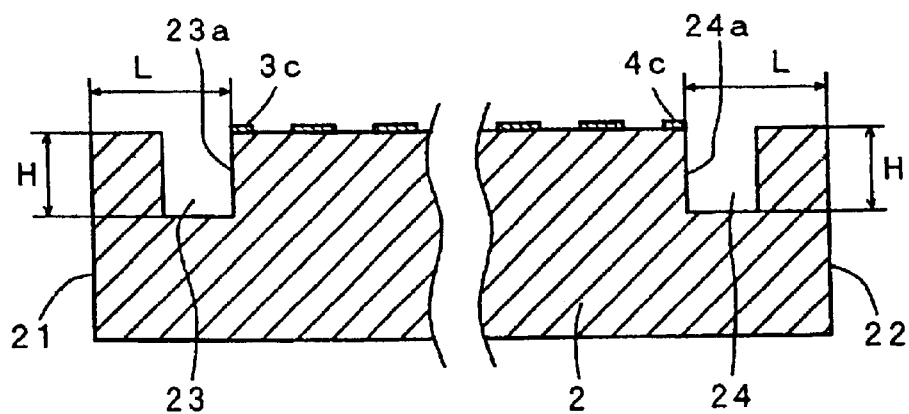
FIG. 2 is a sectional view of the surface acoustic wave device according to the first preferred embodiment of the present invention.

Referring to FIGS. 1 and 2, a surface acoustic wave device according to a first preferred embodiment of the present invention is explained. Although the widths of electrode fingers are illustrated as being wide in the following figures, the electrode fingers of an actual device preferably have very fine widths.

The surface acoustic wave device according to this preferred embodiment is an edge reflection type longitudinally coupled resonator filter, and is provided with a substantially rectangular planar piezoelectric substrate 2. The piezoelectric substrate 2 preferably includes, for example, piezoelectric ceramics such as lead titanate zirconate ceramics or piezoelectric single crystals such as LiNbO$_3$ and LiTaO$_3$. The piezoelectric substrate 2 has substrate edges 21 and 22 which are opposed to each other, and grooves 23 and 24 arranged substantially parallel to the corresponding substrate edges 21 and 22 and extending from the upper surface toward the bottom surface are disposed on the upper surface (one main surface) inside of both of the edges 21 and 22. Inside surfaces 23a and 24a of the grooves 23 and 24 are in contact, with of a maim region of the upper surface and become new inner edges for the main region. As will be explained next, SH type surface acoustic waves are excited on the main region, and therefore, the inside surface 23a and 24a function as reflection edges 23a and 24a.

Two IDTs 3 and 4 are disposed between the grooves 23 and 24 on the upper surface of the piezoelectric substrate 2. The IDT 3 preferably includes a pair of comb-shaped electrodes 3a and 3b, the comb-shaped electrodes 3a and 3b each have a plurality of electrode fingers, and the electrode fingers of the comb-shaped electrodes 3a and 3b are arranged so as to be interleaved with each other. Similarly, the IDT 4 preferably includes a pair of comb-shaped electrodes 4a and 4b, the comb-shaped electrodes 4a and 4b being constituted in the same manner as the comb-shaped electrodes 3a and 3b. Each electrode finger is arranged substantially parallel to the grooves 23 and 24, outermost electrode fingers 3c and 4c of the IDTs 3 and 4 being arranged so that the outer edges thereof may contact with the inside surface 23a and 24a. If the wavelength of the surface acoustic wave is represented by $\lambda$, the widths of the outermost electrode fingers of the IDTs 3 and 4 are approximately $\lambda/8$ and the widths of all of the other electrode fingers are approximately $\lambda/4$.

Although most common edge reflection surface acoustic wave devices include at least one IDT in which the outermost electrode fingers are flush with the respective edges of a piezoelectric substrate, the outermost electrode fingers may be spaced apart from the edges in various preferred embodiments of the present invention.

In this unique construction of preferred embodiments of the present invention, when an input voltage is applied to one IDT, SH-type surface acoustic waves are excited. The excited surface acoustic waves propagate in the direction between the reflection edge 23a with 24a and reflected at the edges 23a and 24a, so that fundamental waves and higher mode waves are generated. As a result, the fundamental waves and the higher mode waves are combined, and standing waves occur between the edges 23a and 24a. Outputs based on the standing waves are extracted by the other IDT, thus operating as longitudinally coupled resonator type filter.

In this surface acoustic wave device, the distances between the reflection edges 23a and 24a and the substrate edges 21 and 22 are respectively about 8$\lambda$ or less. Moreover, the heights of the reflection edges 23a and 24a, i.e. the depths of the grooves 23 and 24, are within the range of about 2$\lambda$ to about 6$\lambda$.

Figure 3:
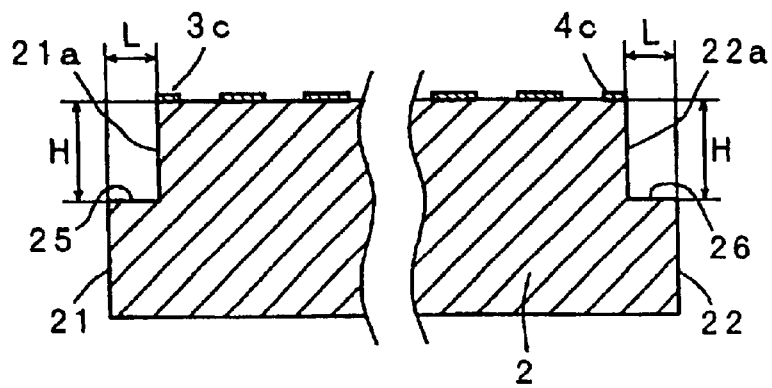
FIG. 3 is a sectional view of a surface acoustic wave device according to a second preferred embodiment of the present invention.

Next, the constitution of the surface acoustic wave device according to a second preferred embodiment of the present invention is shown in FIG. 3. In the surface acoustic wave device of this preferred embodiment, a step is provided on the substrate edges to define the reflection edges. That is, in this surface acoustic wave device, steps 25 and 26 are respectively provided on two opposing edges 21 and 22 of a piezoelectric substrate 2. The steps 25 and 26 are arranged so as to cut the upper surface of the piezoelectric substrate 2 to form a substantially rectangular shape, with edges 21a and 22a above the steps 25 and 26 defining opposing edges as reflection edges. The elements other than those constituting the reflection edges 21a and 22a are the same as the constitution of the first preferred embodiment, and thus an explanation thereof is omitted.

In this surface acoustic wave device, the distances between the reflection edges 21a and 22a and the substrate edges 21 and 22 are respectively about 8$\lambda$ or less, and the heights of the reflection edges 21a and 22a, i.e. the distances H of the steps 25 and 26 from the top surface of the piezoelectric substrate 2, are within the range of about 2$\lambda$ to about 6$\lambda$.

The surface acoustic wave devices of the first and second preferred embodiments are preferably manufactured by the following manner. First, many IDTs constituting the surface acoustic wave devices are formed on a piezoelectric substrate. Next, grooves (23 and 24 in FIGS. 1 and 2) for forming reflection edges are formed on the top surface of the piezoelectric plate by using a dicer or other suitable cutting device or method. The grooves are precisely formed so that chipping or other problems never occur in order that the outermost electrode fingers 3c and 4c have predetermined widths. One side of the side surfaces of the grooves are the reflection edges 21a, 22a, 23a and 24a, and the depths of the grooves (the heights of the reflection edges) are preferably within the range of about 2$\lambda$ to about 6$\lambda$. Next, the outside or inside of the groove is cut by a dicer or other suitable cutting device or method to separate each surface acoustic wave device. Sections at this time form end-surfaces 21 and 22 of the piezoelectric substrate 2, and the sections are set to about 8$\lambda$ or lower from the insides of the respective grooves. If the outsides of the grooves are cut, the surface acoustic wave device of the first preferred embodiment is produced, and if the inside of the grooves is cut, the surface acoustic wave device of the second preferred embodiment is produced and steps are formed on the substrate edges. As described above, edges having high accuracy and without chipping or other problems are formed by cutting the piezoelectric substrate 2 at a different position from the reflection edge after forming the grooves to define the reflection edges.

Subsequently, reasons to limit the distance L between the substrate edges and the reflection edges and the height H of the reflection edges is explained based on experimental results. If such a surface acoustic wave device is in a state before being cut and separated, or if the distance is virtually infinite (in practice, if the distance L is about 500λ or more), reflection of bulk waves at the substrate edge does not occur, and ripples or insertion loss are minimized. In addition, the ripples in the pass-band of insertion loss-frequency characteristics correspond to GDT (group delay time) deviation in the pass-band. Accordingly, the in-band ripples were evaluated with the GDT deviation.

Figure 4:
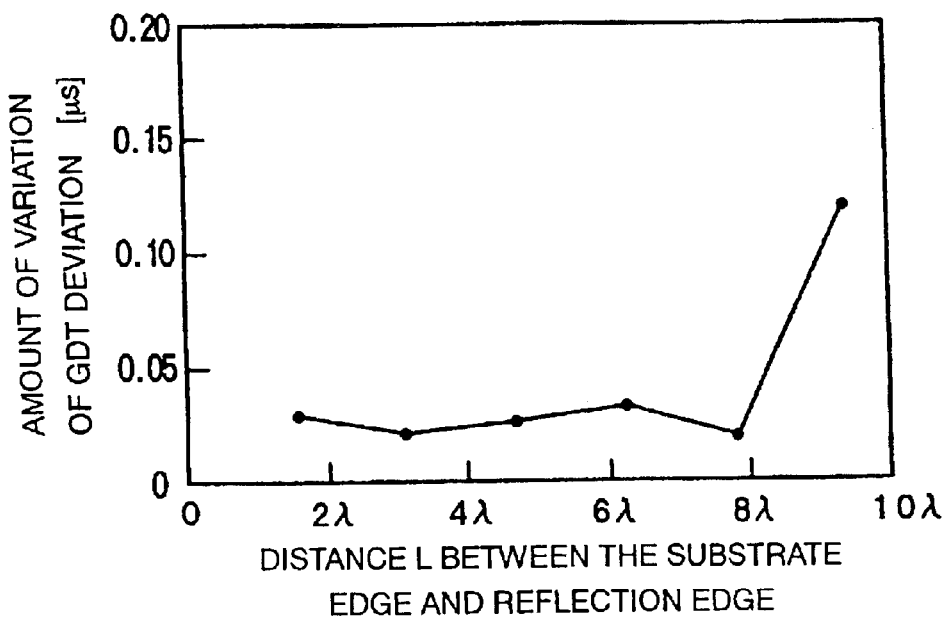
FIG. 4 is a graph showing the relationship between the distance between a substrate edge and a reflection edge, and the amount of variation of in-band GDT deviation.

FIG. 4 shows the relationship between the distance L and the amount of variation of the GDT deviation in the pass-band after the piezoelectric substrate was cut, using the piezoelectric substrate before being cut as a reference criterion, in the surface acoustic wave device of the first and second preferred embodiments. This is a 1st IF filter for a mobile phone with a center frequency of 190 MHz and a pass-band width of 5 MHz, constituted by 34 pairs of electrode fingers on the IDTs 3 and 4, a wavelength λ of 20 μm and a height of the reflection edge of 3λ. As shown in FIG. 4, in-band GDT deviation drastically varies when the distance L between the substrate edge and the reflection edge exceeds about 8λ, the variation amount of GDT deviation is small when the distance L is about 8λ or lower, and the amount of variation of the GDT deviation is large when the distance L exceeds about 8λ. That is, setting the distance L to less than about 8λ can reduce the ripples in the pass-band.

Furthermore, the steps are constructed to prevent chipping or other defects on the reflection edges, so as to form reflection edges with high accuracy. Preferably, the distance L is about λ/10 or more.

Figure 5:
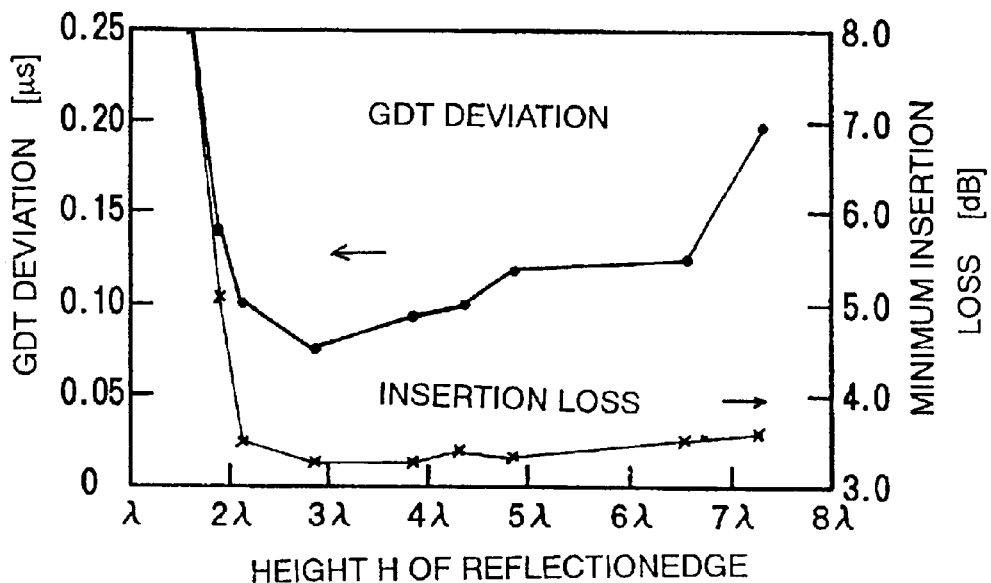
FIG. 5 is a graph showing the relationship between the height of the reflection end-surface and the in-band characteristics (GDT deviation, minimum insertion loss).

FIG. 5 shows the relationship between the height H of the reflection edge and in-band GDT deviation and minimum insertion loss in the surface acoustic wave device according to various preferred embodiments of the present invention. The data is for when the distance L between the substrate edge and the reflection edge is set to λ. As shown in FIG. 5, in-band GDT deviation becomes lower within the range of a height H of the reflection edge by about 2λ to about 6λ, this is a practical level of about 0.125 μs or lower. If the height H of the reflection edge is lower than about 2λ, it cannot reflect the surface acoustic wave energy, and the minimum insertion loss becomes high. That is, if the height H of the reflection edge is set within the range of about 2λ to about 6λ, ripples in the pass-band and insertion loss are minimized to obtain excellent pass-band characteristics. Moreover, as can be understood from FIG. 5, when the height H of the reflection edge is set within the range of about 2λ to about 4λ, the in-band GDT deviation becomes 0.10 μS or less, thereby obtaining greatly improved pass-band characteristics.

Although the preferred embodiments are explained by using an example of the structure of a longitudinally coupled resonator filter that includes a pair of reflection edges, it is not limited to a constitution having the edges on both sides of the IDTs. Alternatively, a device having the reflection edge on one side of the IDT constituting the surface acoustic wave device and the reflector on the other side may be used. For example, when a plurality of surface acoustic wave resonators are arranged on the same piezoelectric substrate to constitute a ladder type filter, a constitution utilizing edge reflections of a reflection edge and reflections of a reflector is preferably used.

Figure 6:
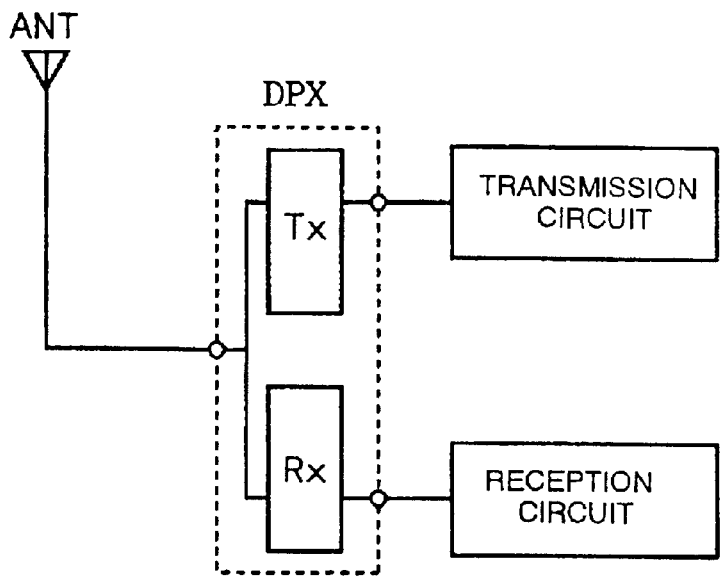
FIG. 6 is a block diagram of a communication device according to a third preferred embodiment of the present invention.

Next, FIG. 6 shows the structure of a communication device according to a third preferred embodiment of the present invention. This communication device is constructed by connecting an antenna ANT to an antenna terminal of a duplexer DPX comprising a transmission filter TX and a reception filter RX, connecting a transmission circuit to an input-terminal of the transmission filter TX, and connecting a reception circuit to an output terminal of the reception filter RX. Transmission signals from the transmission circuit are transmitted from the antenna ANT through the transmission filter TX. Further, received signals received by the antenna ANT are inputted to the reception circuit through the reception filter RX.

Here, the surface acoustic wave device according to the present preferred embodiment of the present invention can function as the reception filter RX, the 1st IF filter of the reception circuit, and various kinds of interstage filters of a communication device or resonance element. By using the surface acoustic wave device according to various preferred embodiments of the present invention, a communication device having excellent characteristics can be obtained.

While preferred embodiments of the invention have been described above, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
a longitudinally coupled resonator filter including:
a piezoelectric substrate having a pair of substrate edges and an upper surface therebetween and including a main region and a bottom surface, the piezoelectric substrate having at least one step formed therein and extending from one of said pair of substrate edges to an inner edge of the at least one step located spaced from the one of the pair of substrate edges, the inner edge of said at least one step being arranged to contact the main region and to extend from the upper surface toward the bottom surface of the piezoelectric substrate inside the one of the pair of substrate edges;
at least two interdigital transducers provided on the main region of the piezoelectric substrate such that shear horizontal type surface acoustic waves excited by the interdigital transducer and having a wavelength of λ are reflected by the at least one inner edge;
wherein a distance L between the inner edge of the at least one step and the corresponding one of the substrate edges is in the range of about λ/10 to about 8λ, and a depth of the at least one step is in the range of about 2λ to about 6λ.

2. A surface acoustic wave device according to claim 1, wherein the piezoelectric substrate is made of at least one of piezoelectric ceramics and piezoelectric single crystals.

3. A surface acoustic wave device according to claim 1, wherein said at least one step comprises a pair of steps arranged such that said inner edges of said pair of steps are substantially parallel to the substrate edges and extending from the upper surface toward the bottom surface of the piezoelectric substrate.

4. A surface acoustic wave device according to claim 1, wherein the inside surfaces define reflection edges for reflecting the shear horizontal type surface acoustic wave.

5. A surface acoustic wave device according to claim 1, wherein the at least two interdigital transducers include a plurality of electrode fingers, and if the wavelength of the surface acoustic wave is represented by $\lambda$, the widths of the outermost electrode fingers of the at least two IDTs are approximately $\lambda/8$ and the widths of all of the other electrode fingers are approximately $\lambda/4$.

6. A communication device comprising:
    at least one surface acoustic wave device including:
        a longitudinally coupled resonator filter comprising:
            a piezoelectric substrate having a pair of substrate edges and an upper surface therebetween and including a main region and a bottom surface, the piezoelectric substrate having at least one step formed therein and extending from one of said pair of substrate edges to an inner edge of the at least one step located spaced from the one of the pair of substrate edges, the inner edge of said at least one step being arranged to contact the main region and to extend from the upper surface toward the bottom surface of the piezoelectric substrate inside the one of the pair of substrate edges;
        at least two interdigital transducers provided on the main region of the piezoelectric substrate such that shear horizontal type surface acoustic waves excited by the interdigital transducer and having a wavelength of $\lambda$ are reflected by the at least one inner edge;
        wherein a distance L between the inner edge of the at least one step and the corresponding one of the substrate edges is in the range of about $\lambda/10$ to about $8\lambda$, a depth of the at least one step is in the range of about $2\lambda$ to about $6\lambda$.

7. A communication device according to claim 6, wherein the piezoelectric substrate is made of at least one of piezoelectric ceramics and piezoelectric single crystals.

8. A communication device according to claim 6, wherein said at least one step comprises a pair of steps arranged substantially parallel to the substrate edges and extending from the upper surface toward the bottom surface of the piezoelectric substrate.

9. A communication device according to claim 8, wherein the inner edge defines a reflection edge for reflecting the shear horizontal type surface acoustic wave.

10. A communication device according to claim 8, wherein the at least two interdigital transducers include a plurality of electrode fingers, and if the wavelength of the surface acoustic wave is represented by $\lambda$, the widths of the outermost electrode fingers of the at least two IDTs are approximately $\lambda/8$ and the widths of all of the other electrode fingers are approximately $\lambda/4$.

11. A surface acoustic wave device comprising:
    an edge reflection type longitudinally coupled resonator filter including:
        a piezoelectric substrate having a pair of substrate edges and an upper surface therebetween and including a main region and a bottom surface, the piezoelectric substrate having at least one step formed therein and extending from one of said pair of substrate edges to an inner edge of the at least one step located spaced from the one of the pair of substrate edges, the inner edge of said at least one step being arranged to contact the main region and to extend from the upper surface toward the bottom surface of the piezoelectric substrate inside the one of the pair of substrate edges;
        at least two interdigital transducers provided on the main region of the piezoelectric substrate such that shear horizontal type surface acoustic waves excited by the interdigital transducer and having a wavelength of $\lambda$ are reflected by the at least one inner edge;
        wherein a distance L between the inner edge of the at least one step and the corresponding one of the substrate edges is in the range of about $\lambda/10$ to about $8\lambda$, and a depth of the at least one step is in the range of about $2\lambda$ to about $6\lambda$.

* * * * *